(12) United States Patent
Najjar et al.

(10) Patent No.: US 8,193,274 B2
(45) Date of Patent: Jun. 5, 2012

(54) METAL-CLAD LAMINATES HAVING IMPROVED PEEL STRENGTH AND COMPOSITIONS USEFUL FOR THE PREPARATION THEREOF

(75) Inventors: Sam Najjar, Yucaipa, CA (US); Chenghong Li, Cary, NC (US); Thomas Allan Koes, Riverside, CA (US); Daniel Chang, Fullerton, CA (US)

(73) Assignee: Arlon, Bear, DE (US)

( * ) Notice: Subject to any disclaimer, the term of this patent is extended or adjusted under 35 U.S.C. 154(b) by 612 days.

(21) Appl. No.: 12/184,994

(22) Filed: Aug. 1, 2008

(65) Prior Publication Data

US 2009/0176106 A1 Jul. 9, 2009

Related U.S. Application Data

(63) Continuation-in-part of application No. 11/971,122, filed on Jan. 8, 2008.

(51) Int. Cl.
*C08L 39/04* (2006.01)
*B32B 27/04* (2006.01)

(52) U.S. Cl. ............... 524/516; 525/193; 428/297.4; 428/500; 264/136; 427/331

(58) Field of Classification Search .......... 524/540, 524/841, 516; 525/410, 193; 428/500, 297.4; 427/331; 264/136
See application file for complete search history.

(56) References Cited

U.S. PATENT DOCUMENTS

| | | | | |
|---|---|---|---|---|
| 4,100,140 A | * | 7/1978 | Zahir et al. | 526/90 |
| 4,288,583 A | * | 9/1981 | Zahir et al. | 526/262 |
| 4,806,267 A | * | 2/1989 | Culbertson et al. | 252/182.23 |
| 4,843,142 A | * | 6/1989 | Sano et al. | 528/211 |
| 5,447,988 A | | 9/1995 | Dershem et al. | |
| 6,235,866 B1 | | 5/2001 | Khouri et al. | |
| 6,946,523 B2 | | 9/2005 | Dersham et al. | |
| 7,037,447 B1 | | 5/2006 | Yang et al. | |
| 2005/0288457 A1 | | 12/2005 | Liu et al. | |
| 2007/0135609 A1 | | 6/2007 | Carrillo et al. | |
| 2007/0295454 A1 | | 12/2007 | Edwards et al. | |
| 2009/0176918 A1 | * | 7/2009 | Najjar et al. | 524/404 |

FOREIGN PATENT DOCUMENTS

JP 07165837 A * 6/1995

OTHER PUBLICATIONS

Machine translation of JP 07-165837 A, Jun. 27, 1995.*

* cited by examiner

*Primary Examiner* — Vickey Nerangis
(74) *Attorney, Agent, or Firm* — Foley & Lardner LLP; Stephen E. Reiter

(57) ABSTRACT

In accordance with the present invention, compositions are described which are useful, for example, for the preparation of metal-clad laminate structures, methods for the preparation thereof, and various uses therefor. Invention metal-clad laminate structures are useful, for example, multi-layer board (MLB) industry, in the preparation of burn-in test boards and high reliability boards, applications where low coefficient of thermal expansion (CTE) is beneficial, in the preparation of boards used in down-hole drilling, and the like.

49 Claims, No Drawings

METAL-CLAD LAMINATES HAVING IMPROVED PEEL STRENGTH AND COMPOSITIONS USEFUL FOR THE PREPARATION THEREOF

RELATED APPLICATIONS

This application is a continuation-in-part of U.S. application Ser. No. 11/971,122, filed Jan. 8, 2008, now pending, the entire contents of which are hereby incorporated by reference in their entirety.

FIELD OF THE INVENTION

The present invention relates to metal-clad laminate structures, and compositions useful for the preparation thereof, as well as methods for making same, and uses thereof. Invention metal-clad laminate structures are useful, for example, in the multi-layer board (MLB) industry, in the preparation of burn-in test boards and high reliability boards, applications where low coefficient of thermal expansion (CTE) is beneficial, in the preparation of boards used in down-hole drilling, and the like.

BACKGROUND OF THE INVENTION

Materials employed in the preparation of equipment used in cellular telecommunications, laminate-based chip carriers, and the like, must meet a number of physical performance criteria (e.g., good heat resistance, good dimensional stability, low density, good adhesion to substrate(s), toughness, and the like), and electrical performance criteria (e.g., low loss, low dielectric constant, and the like).

A variety of materials have been employed in the art for the preparation of the components used for the assembly of such equipment, such as, for example, maleimide-based resins.

Maleimide-based resins are thermosettable resins that have been widely used in the preparation of composite materials. Such materials, however, frequently have less than desirable handling properties due to the high melting points thereof, and the brittleness of the resulting resins prepared therefrom.

In view of the high demand and widespread use of such materials, in addition to meeting the above-described physical and electrical performance properties, it is further desirable that such materials can be prepared from relatively inexpensive starting materials employing readily scalable, low cost processes. The present invention addresses these and other needs as described in greater detail herein.

SUMMARY OF THE INVENTION

In accordance with the present invention, there are provided novel compositions which are useful, for example, for the preparation of metal-clad laminate structures, methods for the preparation thereof, and various uses therefor. Invention metal-clad laminate structures are useful, for example, in the multi-layer board (MLB) industry, in the preparation of burn-in test boards and high reliability boards, applications where low coefficient of thermal expansion (CTE) is beneficial, in the preparation of boards used in down-hole drilling, and the like.

DETAILED DESCRIPTION OF THE INVENTION

In accordance with one aspect of the present invention, there are provided compositions comprising:
(a) a crosslinkable maleimide compound,
(b) a crosslinkable oxazoline compound,
(c) a crosslinkable compound capable of reacting with (a) and/or (b), and
(d) at least one performance-modifying component.

The relative weight ratios of the above-described components can vary widely. Typically, the weight ratio between (a) and (c) will fall in the range of at least about 1:20 up to about 20:1. In some embodiments of the present invention, the weight ratio between (a) and (c) falls in the range of at least about 1:10 up to about 10:1. In other embodiments of the present invention, the weight ratio between (a) and (c) falls in the range of at least about 1:5 up to about 5:1. In still other embodiments of the present invention, the weight ratio between (a) and (c) falls in the range of about 1:1 up to about 3:1.

As employed herein, "about" means in quantitative terms plus or minus 10%.

The further presence of component (b) can also vary widely, depending on such factors as the nature of the reactive substituents thereon, the degree of substitution, and the like. Typically, component (b) is present in the range of about 1-10 wt %, based on the total weight of components (a) and (c), taken together. It is presently preferred that component (b) be present in the range of about 3-5 wt %, based on the total weight of components (a) and (c), taken together.

A wide variety of crosslinkable maleimides are suitable for use in the practice of the present invention. For example, exemplary crosslinkable maleimides have the structure:

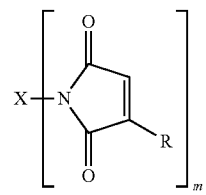

(I)

wherein:

X is optionally substituted alkylene, cycloalkylene, arylene, polyarylene, heteroarylene or polyheteroarylene, each R is independently H or optionally substituted lower alkyl, and m is at least 2 (up to about 10).

As employed herein, "alkyl" refers to hydrocarbyl radicals having 1 up to 20 carbon atoms, preferably 2-10 carbon atoms; and "substituted alkyl" comprises alkyl groups further bearing one or more substituents selected from hydroxy, alkoxy (of a lower alkyl group), mercapto (of a lower alkyl group), cycloalkyl, substituted cycloalkyl, heterocyclic, substituted heterocyclic, aryl, substituted aryl, heteroaryl substituted heteroaryl, aryloxy, substituted aryloxy, halogen, trifluoromethyl, cyano, nitro, nitrone, amino, amido, C(O)H, acyl, oxyacyl, carboxyl, carbamate, sulfonyl, sulfonamide, sulfuryl, and the like.

As employed herein, "lower alkyl" refers to hydrocarbyl radicals having 1 up to 6 carbon atoms, preferably 1-4 carbon atoms; and "substituted lower alkyl" comprises lower alkyl groups farther bearing one or more substituents as described herein.

As employed herein, "alkylene" refers to divalent hydrocarbyl radicals having 1 up to 20 carbon atoms, preferably 2-10 carbon atoms; and "substituted alkylene" comprises alkylene groups farther bearing one or more substituents as set forth above.

As employed herein, "cycloalkylene" refers to divalent cyclic ring-containing groups containing in the range of about 3 up to 8 carbon atoms, and "substituted cycloalkylene" refers to cycloalkylene groups further bearing one or more substituents as set forth above.

As employed herein, "arylene" refers to divalent aromatic groups having in the range of 6 up to 14 carbon atoms and "substituted arylene" refers to arylene groups further bearing one or more substituents as set forth above.

As employed herein, "polyarylene" refers to a divalent moiety comprising a plurality (i.e., at least two, up to about 10) divalent aromatic groups (each having in the range of 6 up to 14 carbon atoms), wherein said divalent aromatic groups are linked to one another directly, or via a 1-3 atom linker; and "substituted polyarylene" refers to polyarylene groups further bearing one or more substituents as set forth above.

As employed herein, "heteroarylene" refers to divalent aromatic groups containing one or more heteroatoms (e.g., N, O, S, or the like) as part of the ring structure, and having in the range of 3 up to 14 carbon atoms; and "substituted arylene" refers to arylene groups further bearing one or more substituents as set forth above.

As employed herein, "polyheteroarylene" refers to a divalent moiety comprising a plurality (i.e., at least two, up to about 10) heteroarylene groups (each containing at least one heteroatom, and in the range of 3 up to 14 carbon atoms), wherein said heteroarylene groups are linked to one another directly, or via a 1-3 atom linker; and "substituted polyheteroarylene" refers to polyheteroarylene groups further bearing one or more substituents as set forth above.

In some embodiments of the present invention, X of the above-described crosslinkable maleimide is optionally substituted alkylene.

In other embodiments of the present invention, X of the above-described crosslinkable maleimide is optionally substituted cycloalkylene.

In still other embodiments of the present invention, X of the above-described crosslinkable maleimide is optionally substituted arylene.

In yet other embodiments of the present invention, X of the above-described crosslinkable maleimide is optionally substituted bis-arylene. Exemplary bis-arylene compounds contemplated for use in the practice of the present invention have the structure:

—Ar—Y—Ar—, wherein:
each Ar is independently phenylene or substituted phenylene, and
Y is a bond, —O—, —S(O)$_m$—, wherein m is 0, 1 or 2, or —(CR'$_2$)$_x$—, wherein each R' is independently H, halogen, or optionally substituted lower alkyl, and x is 1-10.

In presently preferred embodiments of the present invention, each Ar of the above-described bis-arylene moiety is optionally substituted phenylene, Y is —(CR'$_2$)$_x$—, each R' is independently H or lower alkyl, and x is 0 or 1. In particularly preferred embodiments, X is -Ph-CH$_2$-Ph-, and each phenylene is optionally substituted. Optional substitution of the phenylene moieties is preferably at the meta or para position.

Exemplary crosslinkable maleimides contemplated for use in the practice of the present invention are selected from the group consisting of N,N'-m-phenylene bismaleimide, N,N'-p-phenylene bismaleimide, N,N'-m-toluilene bismaleimide, N,N'-4,4'-biphenylene bismaleimide, N,N'-4,4'-[3,3'-dimethyl-biphenylene]bismaleimide, N,N'-4,4'-[3,3'-dimethyl-diphenylmethane]bismaleimide, N,N'-4,4'-[3,3'-diethyl-diphenylmethane]bismaleimide, N,N'-4,4'-diphenylmethane bismaleimide, N,N'-4,4'-diphenylpropane bismaleimide, N,N'-4,4'-diphenylether bismaleimide N,N'-3,3'-diphenylsulfone bismaleimide, N,N'-4,4'-diphenylsulfone bismaleimide, 2,2-bis[4-(4-maleimidephenoxy)phenyl]nonane, 2,2-bis[3-tertiary butyl-4-(-maleimidephenoxy)phenyl]propane, 2,2-bis[3-secondary butyl-4-(4-maleimidephenoxy)phenyl]propane, 1,1-bis[4-(4-maleimidephenoxy)phenyl]decane, 1,1-bis[2-methyl-4-(4-maleimidephenoxy)-5-tertiary butyl phenyl]-2-methylpropane, 4,4'-cyclohexylidene-bis[1-(4-maleimidephenoxy)-2-(1,1-dimethylethyl)benzene], 4,4'-methylene-bis[1-(4-maleimidephenoxy)-2,6-bis(1,1'-dimethylethyl)benzene], 4,4'-methylene-bis[1-(4-maleimidephenoxy)-2,6-di-secondary butyl benzene], 4,4'-cyclohexylidene-bis[1-(4-maleimidephenoxy)-2-cyclohexylbenzene], 4,4'-methylene-bis[1-(maleimidephenoxy)-2-nonylbenzene], 4,4'-(1-methylethylidene)-bis[1-(maleimidephenoxy)-2,6-bis(1,1'-dimethylethyl)benzene, 4,4'-(2-ethylhexylidene)-bis[1-(maleimidephenoxy)-benzene], 4,4'-(1-methylheptylidene)-bis[1-(maleimidephenoxy)-benzene], 4,4'-cyclohexylidene-bis[1-(maleimidephenoxy)-3-methylbenzene], and the like.

A wide variety of crosslinkable oxazolines are suitable for use in the practice of the present invention. For example, exemplary crosslinkable oxazolines have the structure:

Z—(Ox)$_n$, wherein:
Ox is an optionally substituted oxazoline ring,
Z is optionally substituted alkylene, cycloalkylene, arylene, polyarylene, heteroarylene or polyheteroarylene, and
n is at least 2.

In some embodiments of the present invention, Z of the above-described crosslinkable oxazoline is optionally substituted alkylene.

In other embodiments of the present invention, Z of the above-described crosslinkable oxazoline is optionally substituted cycloalkylene.

In still other embodiments of the present invention, Z of the above-described crosslinkable oxazoline is optionally substituted arylene. Presently preferred crosslinkable oxazolines according to the invention are compounds wherein Z is 1,3-phenylene.

Exemplary crosslinkable oxazoline compounds contemplated for use in the practice of the present invention are selected from the group consisting of 1,2-bis(2-oxazoline-2)ethane, 1,4-bis(2-oxazoline-2)butane, 1,6-bis(2-oxazoline-2)hexane, 1,8-bis(2-oxazoline-2)octane, or 1,4-bis(2-oxaziline-2)cyclohexane; compounds in which 2 oxazoline rings have been bonded to an aromatic moiety such as for instance, 1,2-bis(2-oxazolinyl-2)benzene, 1,3-bis(2-oxazolinyl-2)benzene, 1,4-bis(2-oxazolinyl-2)benzene, 5,5'-dimethyl-2,2'-bis(2-oxazolinyl-2)benzene, 4,4,4',4'-tetramethyl-2,2'-bis(2-oxazolinyl-2)benzene, 1,2-bis(5-methyl-2-oxazolinyl-2)benzene, 1,3-bis(5-methyl-2-oxazolinyl-2)benzene, or 1,4-bis(5-methyl-2-oxazolinyl-2)benzene; or 2,2'-bis(2-oxazoline), 2,2'-bis(4-methyl-2-oxazoline), 2,2'-bis(5-methyl-2-oxazoline), and the like.

A wide variety of materials can be employed as the crosslinkable compound capable of reacting with component (a) described above (i.e., crosslinkable maleimide) and/or component (b) described above (i.e., crosslinkable oxazoline). One such material is an allylically substituted hydroxy-aromatic compound.

A wide variety of allylically substituted hydroxy-aromatic compounds are suitable for use in the practice of the present invention. For example, exemplary allylically substituted hydroxy-aromatic compounds have the structure:

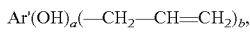
Ar'(OH)$_a$(—CH$_2$—CH=CH$_2$)$_b$, wherein:

Ar' is optionally substituted arylene, polyarylene, heteroarylene or polyheteroarylene, a is at least 2, and b is at least 2.

In some embodiments of the present invention, Ar' of the above-described allylically substituted hydroxy-aromatic compound is optionally substituted bis-arylene. Exemplary bis-arylene compounds contemplated for use in the practice of the present invention have the structure:

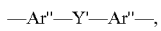
—Ar''—Y'—Ar''—, wherein:

each Ar'' is independently phenylene or substituted phenylene bearing at least one OH and at least one —CH$_2$—CH=CH$_2$ thereon, and Y' is a bond, —O—, —S(O)$_m$—, wherein m is 0, 1 or 2, or —(CR'$_2$)$_x$—, wherein each R' is independently H, halogen, or optionally substituted lower alkyl, and x is 1-10.

In presently preferred embodiments of the present invention, each Ar'' of the above-described allylically substituted hydroxy-aromatic compound is phenlyene, and Y' is —(CR'$_2$)$_x$—, wherein each R' is independently H or lower alkyl, and x is 0 or 1.

In particularly preferred embodiments of the present invention, Ar' of the above-described allylically substituted hydroxy-aromatic compound is -Ph-C(CH$_3$)$_2$-Ph-. One such allylically substituted hydroxy-aromatic compound is an allylically substituted bisphenol A. A presently preferred allylically substituted bisphenol A is diallyl bisphenol A. In one embodiment, at least one allylic substitution on the phenolic compound is at the meta position. In another embodiment, at least one allylic substitution on the phenolic compound is at the para position.

Exemplary hydroxy-aromatic compounds which can optionally be allylically substituted according to the invention, and which are contemplated for use in the practice of the present invention are selected from the group consisting of 1,4-benzenediol, 1,3-benzenediol, 1,5-naphthalenediol, biphenoldiol, 4,4'-(1-methylethylidene)bisphenol, 2,2'-methylenebisphenol, 4,4'-(phenylmethylene)bisphenol, 4,4'-(cyclohexanediyl)bisphenol, 4,4'-(1,2-diethyl-1,2-ethyldiyl)bisphenol, 3,4-bis(4-hydroxyphenyl)-2,4-hexadiene, 4,4'-methylidene-bis[2,6-dimethylphenol], 4,4'-(1-methylethylidene)bis[2-methylphenol], 4,4'-cyclohexylidene bisphenol, 4,4'-(1,3-dimethylheptylidene)bisphenol, 4,4'-(1-methylethylidene)bis[2,6-dimethylphenol], 4,4'-(1-phenylethylidene) bisphenol, 4,4'-(2-ethylhexylidene)bisphenol, 4,4'-cyclohexylidenebis[3-methylphenol], 4,4'-[1,4-phenylenebis(1-methylethylidene)bis(2-methylphenol)], 4,4'-oxybisphenol, 4,4'-cyclopentylidene bisphenol, 4,4'-cyclohexylidenebis[2,6-dimethylphenol], 4,4'-(1-methyl)nonylidene bisphenol, 4,4'-decylidene bisphenol, 4,4'-cyclohexylidenebis[2-(1,1-dimethylethyl) phenol], 4,4'-(2-methylpropylidene)bis[3-methyl-6-(1,1,1-dimethylethyl)phenol], bis(4-hydroxyphenyl)methanone, 4,4'-[2,2,2-trifluoro-1-(trifluoromethyl)ethylidene]bisphenol, 3,9-bis(hydroxyphenyl)-tricyclo-[5,2,1,0$^{2,6}$]decane, and the like.

Performance-modifying components contemplated for use in the practice of the present invention include fillers, curing agents, cure retardants, cure accelerators, flexibilizers, antioxidants, flame retardants, fire retardants, dyes (e.g., fluorescent dyes), pigments, flow modifiers, plasticizers, surfactants, strength enhancers, UV protectors (especially UV blocking dyes appropriate to enable Automatic-Optical Inspection (AOI) of Circuitry), and the like, as well as mixtures of any two or more thereof.

Performance-modifying components are typically present in the range of about 1% up to about 200% by weight, based on the total weight of components (a), (b) and (c), taken together, with in the range of about 20% up to about 150% by weight, based on the total weight of the other components of the formulation preferred; and in the range of about 40% up to about 120% by weight, based on the total weight of the other components of the formulation, especially preferred.

Fillers contemplated for use in the practice of the present invention may optionally be conductive (electrically and/or thermally). Both powder and flake forms of filler may be used in the compositions of the present invention. Fillers having a wide range of particle sizes can be employed in the practice of the present invention. Typically particle sizes ranging from nanoparticles up to about 80 microns are employed, with particle sizes of less than about 20 microns being preferred, and particle sizes in the range of about 0.5 up to about 15 microns being particularly preferred.

A wide variety of fillers can be employed in the practice of the present invention, e.g., soft fillers (e.g., talc), naturally occurring minerals (e.g., aluminum nitride, boron nitride, silicon carbide, diamond, graphite, beryllium oxide, magnesia, silica, alumina, aluminum silicates, and the like), synthetic fused minerals (e.g., cordierite), treated fillers (e.g., silane-treated minerals), organic polymers (e.g., polytetrafluoroethylene), and microspheres.

Electrically conductive fillers contemplated for use in the practice of the present invention include, for example, silver, nickel, gold, cobalt, copper, aluminum, graphite, silver-coated graphite, nickel-coated graphite, alloys of such metals, and the like, as well as mixtures thereof.

Thermally conductive fillers contemplated for optional use in the practice of the present invention include, for example, aluminum nitride, boron nitride, silicon carbide, diamond, graphite, beryllium oxide, magnesia, silica, alumina, and the like. Preferably, the particle size of these fillers will be about 20 microns. If aluminum nitride is used as a filler, it is preferred that it be passivated via an adherent, conformal coating (e.g., silica, or the like).

Electrically and/or thermally conductive fillers are optionally (and preferably) rendered substantially free of catalytically active metal ions by treatment with chelating agents, reducing agents, nonionic lubricating agents, or mixtures of such agents. Such treatment is described in U.S. Pat. No. 5,447,988, which is incorporated by reference herein in its entirety.

Optionally, a filler may be used that is neither an electrical nor thermal conductor. Such fillers may be desirable to impart some other property to the adhesive formulation such as, for example, reduced thermal expansion of the cured adhesive, reduced dielectric constant, improved toughness, increased hydrophobicity, and the like. Examples of such fillers include perfluorinated hydrocarbon polymers (i.e., TEFLON™), thermoplastic polymers, thermoplastic elastomers, mica, fumed silica, fused silica, glass powder, and the like.

Invention compositions may alternatively, or in addition, contain one or more curing agents to promote the crosslinking reaction between the various components of the above-described formulations. Suitable curing agents include aryl phosphites.

Exemplary aryl phosphites contemplated for use herein include diphenyl hydrogen phosphite (DPP); dicresyl (preferably meta or para) hydrogen phosphite; phenyl p-cresyl hydrogen phosphite; phenyl m-cresyl hydrogen phosphite; dinaphthyl hydrogen phosphite; diphenyl isopropyl phosphite; diphenyl methyl phosphite, di(p-cresyl)hexyl phosphite, triphenyl phosphite (TPP), tri(m-cresyl)phosphite, diphenyl isooctyl phosphite, diphenyl 2-ethylhexyl phosphite, diphenyl isodecyl phosphite, diphenyl cyclohexyl phosphite, 2-chloroethyl diphenyl phosphite, and the like.

Invention compositions may alternatively, or in addition, include one or more additional components such as flexibilizers, anti-oxidants, flame retardants, dyes, pigments, surfactants, and the like.

Presently preferred performance enhancing components contemplated for use in the practice of the present invention include one or more of fillers, fire retardants, fluorescent dyes, pigments, flow modifiers, plasticizers, cure retardants, cure accelerators, strength enhancers, UV protectors (especially UV blocking dyes appropriate to enable Automatic-Optical Inspection (AOI) of Circuitry), and the like, as well as mixtures of any two or more thereof.

Fire retardants contemplated for use in the practice of the present invention include substantially halogen-free fire retardants, halogenated fire retardants, phosphorus-containing fire retardants, additive and/or reactive flame retardants which may serve as intumescents or char formers, silanes, siloxanes, low melting glasses, zinc-, boron-, aluminum-, or magnesium-based fire retardants, and the like.

Specific compounds contemplated for use as fire retardants include phosphites, phosphates (e.g., butylated triphenyl phosphate, ammonium polyphosphate (APP), and the like), phosphonates, nitrogenes (e.g., melamine derivatives), bromine-containing fire retardants (e.g., brominated styrenes), zinc- and/or boron-based fire retardants (e.g., zinc borate, zinc stannate, borax, and the like), aluminum-based fire retardants (e.g., aluminum trihydrate (ATH)), magnesium-based fire retardants (e.g., magnesium hydroxide), and the like, as well as combinations of any two or more thereof.

Dyes contemplated for use in certain embodiments of the present invention include nigrosine, Orasol blue GN, phthalocyanines, Fluoral green gold dye, and the like. When used, organic dyes in relatively low amounts (i.e., amounts less than about 0.2% by weight) provide contrast.

Pigments contemplated for use in certain embodiments of the present invention include any particulate material added solely for the purpose of imparting color to the formulation, e.g., carbon black, metal oxides (e.g., $Fe_2O_3$, titanium oxide), and the like. When present, pigments are typically present in the range of about 0.5 wt. % up to about 5 wt. %, relative to the base formulation.

Flow modifiers may optionally be employed in the practice of the present invention to alter the resin flow in order to facilitate achieving desired fill and/or lamination properties. Use of such optional additives may thereby (1) enhance intralaminar adhesion and/or (2) produce a multi-layered board by bonding resinous prepregs to layers comprising etched circuitry. When employed in accordance with the present invention, such additives are likely to be used at minimum loading levels (e.g., in the range of about 1 up to about 10 weight percent, based on the total weight of the formulation) to gain the benefit such additives can impart (e.g., enhanced heat and pressure induced flow) without compromising other physical and electrical properties.

Flow modifiers contemplated for use herein may be non-reactive or reactive (i.e., capable of participating in oxidative cross-linking). Such materials will desirably exhibit electrical and physical properties which are compatible with all of the components of the above-described compositions.

Exemplary flow modifiers contemplated for use in the practice of the present invention include monomeric, oligomeric, or polymeric (i.e., thermoplastic) saturated (aliphatic) hydrocarbons, unsaturated hydrocarbons, and the like.

Plasticizers (also called flexibilizers) contemplated for use in certain embodiments of the present invention include compounds that reduce the brittleness of the formulation, such as, for example, branched polyalkanes or polysiloxanes that lower the glass transition temperature (Tg) of the formulation. Such plasticizers include, for example, polyethers, polyesters, polythiols, polysulfides, and the like. Plasticizers, when employed, are typically present in the range of about 0.5 wt. % up to about 30 wt. % of the formulation.

Cure retardants (also known as cell size regulators or quenching agents) contemplated for use in certain embodiments of the present invention include compounds which form radicals of low reactivity, such as, for example, silicone surfactants (generally), and the like.

Cure accelerators contemplated for use in certain embodiments of the present invention include compounds which enhance the rate of cure of the base polymer system, such as, for example, catalytically active materials, water, and the like.

Strength enhancers contemplated for use in certain embodiments of the present invention include compounds which increase the performance properties of the polymeric material to which they are added, such as, for example, crosslinking agents, and the like.

UV protectors contemplated for use in certain embodiments of the present invention include compounds which absorb incident ultraviolet (UV) radiation, thereby reducing the negative effects of such exposure on the resin or polymer system to which the protector has been added. Exemplary UV protectors include bis(1,2,2,6,6-pentamethyl-4-piperidinyl) sebacate, silicon, powdered metallic compounds, hindered amines (known in the art as "HALS"), and the like.

In accordance with yet another embodiment of the present invention, there are provided articles comprising a layer of the above-described composition on a substrate.

As readily recognized by those of skill in the art, a variety of substrates are suitable for use in the practice of the present invention, for example, polyesters, polyamides, polyolefines, polyphenylene oxides, conductive metals, and the like, as well as combinations of any two or more thereof.

When conductive metal substrates are employed, such materials as silver, nickel, gold, cobalt, copper, aluminum, graphite, silver-coated graphite nickel-coated graphite, alloys of such metals, and the like, are contemplated for use herein.

In accordance with still another embodiment of the present invention, there are provided methods of making the above-described articles (i.e., articles comprising composition according to the invention on a substrate), said methods comprising applying invention composition to a substrate and, if diluent is optionally employed to facilitate such application, removing substantially all diluent therefrom.

Optional diluents contemplated for use in the practice of the present invention include aromatic, aliphatic, cycloaliphatic, and the like, as well as combinations of any two or more thereof. As readily recognized by those of skill in the art, diluents may be reactive or non-reactive. Non-reactive diluents remain unchanged by the chemical processes that may occur in their presence, whereas reactive diluents participate in one way or another in the reaction, e.g., by dissolving one or more of the other reactants, by promoting reaction, or by being consumed as part of the reaction occurring in its presence.

Presently preferred diluents contemplated for optional use in the practice of the present invention are non-reactive diluents which are relatively non-polar. Exemplary diluents contemplated for use herein include toluene, hexane, cyclohexane, and the like, as well as mixtures of any two or more thereof.

In accordance with yet another embodiment of the present invention, there are provided prepregs produced by impregnating a porous substrate with a composition according to the invention, and, if diluent is optionally employed to facilitate such application, subjecting the resulting impregnated substrate to conditions suitable to remove substantially all of the diluent therefrom.

As readily recognized by those of skill in the art, a variety of porous substrates can be employed for the preparation of invention prepregs. For example, the substrate can be either woven or non-woven.

Exemplary materials employed for preparation of substrates contemplated for use herein include fiberglass, quartz, polyester fiber, polyamide fiber, polyphenylene sulfide fiber, polyalkylene fiber, liquid crystalline polymer, poly(p-phenylene-2,6-benzobisoxazole), and the like, as well as mixtures of any two or more thereof.

Presently preferred materials employed for preparation of substrates contemplated for use herein include aramid fiber, polytetrafluoroethylene, a copolymer of tetrafluoroethylene and perfluoromethylvinyl ether (MFA), and the like.

In accordance with yet another embodiment of the present invention, there are provided methods of making prepregs comprising a porous substrate impregnated with a composition according to the invention, said methods comprising impregnating a porous substrate with invention composition, and, if diluent is optionally employed to facilitate such application, subjecting the resulting impregnated substrate to conditions suitable to remove substantially all of the diluent therefrom. The resulting resin content will typically fall in the range of about 25 up to about 90%.

As employed herein, the term "porous substrate" refers to a woven or non-woven substrate which can include, but is not limited to, woven glass, non-woven glass, woven aramid fibers, non-woven aramid fibers, woven liquid crystal polymer fibers, non-woven liquid crystal polymer fibers, woven synthetic polymer fibers, non-woven synthetic polymer fibers, randomly dispersed fiber reinforcements, expanded polytetrafluoroethylene (PTFE) structures and combinations of any two or more thereof. Specifically, materials contemplated for use as the "porous substrate" can include, but are not limited to, fiberglass, quartz, polyester fiber, polyamide fiber, polyphenylene sulfide fiber, polyetherimide fiber, cyclic olefin copolymer fiber, polyalkylene fiber, liquid crystalline polymer, poly(p-phenylene-2,6-benzobisoxazole), copolymers of polytetrafluoroethylene and perfluoromethylvinyl ether (MFA) and combinations of any two or more thereof.

As employed herein, "combination," when used to refer to polymers, embraces blends, copolymers, coplanar layers, and the like, of any two or more of the polymer or resin materials.

In accordance with still another embodiment of the present invention, there are provided laminated sheets produced by layering and molding a prescribed number of sheets of the above-described prepreg.

Laminated sheets according to the invention have many particularly beneficial properties, such as, for example, low dielectric constant, low electrical loss tangent, high thermal decomposition temperature, and the like.

In a preferred embodiment, laminated sheets according to the present invention have a dielectric constant $\leq 4.5$ nominal, electrical loss tangent $\leq 0.02$, and a glass transition temperature of at least 80° C.

In accordance with yet another embodiment of the present invention, there are provided methods of making a laminated sheet, said method comprising layering and molding a prescribed number of sheets of a prepreg according to the invention.

In accordance with a further embodiment of the present invention, there are provided printed wiring boards produced by forming conductive patterns on the surface of the above-described laminated sheet(s).

In accordance with a still further embodiment of the present invention, there are provided methods of making printed wiring boards, said methods comprising forming conductive patterns on the surface of a laminated sheet according to the invention.

In accordance with yet another embodiment of the present invention, there are provided multilayer printed wiring boards produced by layering and molding a prescribed number of sheets of the above-described prepreg, to obtain a printed wiring board for an inner layer, and layering the prepreg on the printed wiring board for an inner layer which forms conductive patterns on the surface.

In accordance with still another embodiment of the present invention, there are provided methods of making multilayer printed wiring board, said methods comprising layering and molding a prescribed number of sheets of prepreg according to the invention, to obtain a printed wiring board for an inner layer, and layering the prepreg on the printed wiring board for an inner layer which forms conductive patterns on the surface.

The invention will now be described in greater detail by reference to the following non-limiting examples.

Example 1

An exemplary filled resin formulation according to the invention was prepared employing different levels of filler, as summarized in the following table. Thus, the following components were combined:
  alumina (at 25-150 PHR),
  1,3 PBO (phenylenebisoxazoline; 5 PHR),
  allylated BMI (Kerimid 8292; available from Huntsman, Salt Lake City, Utah) and
  TPP catalyst (0.05 PHR).
Control represents no 1,3 PBO and no filler.
Performance properties are presented in the following table:

| Parameter/Property | Control | 25 phr | 50 phr | 100 phr | 150 phr |
|---|---|---|---|---|---|
| Prepreg 7628, % RC/% Flow | 32/10 | 34/8 | 38/8 | 46/12 | 49/12 |
| CTE-x 50-150° C. | 12.9 | 10.6 | 14.9 | 14.6 | 12.6 |
| CTE-y 50-150° C. | 12.1 | 9.04 | 12.4 | 13.2 | 15.7 |
| CTE-z 50-150° C. | 33.8 | 32.1 | 32.0 | 40.3 | 30.3 |
| % z-Exp. 50-250° C. | 1.13 | 1.27 | 1.33 | 1.40 | 1.09 |
| Tg (TMA), ° C. | 250.6 | 250.2 | 245.2 | 237.4 | 250.4 |
| $T_{288}$, minutes | >60 | >60 | >60 | >60 | >60 |
| $T_{300}$, minutes | >60 | >60 | >60 | >60 | >60 |
| Peel Strength (AR/AS), lbs/in | 5.2/4.8 | 7.8/7.5 | 8.0/7.6 | 7.9/6.9 | 7.2/7.3 |
| Solder Float, seconds | 900 | 553 | 253 | 116 | 44 |
| Laminate Thickness, Mils | 55.8 | 59.9 | 57.8 | 60.23 | 57.7 |
| Water Uptake, % | 0.14 | 0.12 | 0.12 | 0.12 | 0.14 |
| Interlaminar Bond Strength * | 3.3 | 2.8 | 3.4 | 3.5 | 4.1 |

Each of the parameters presented in the preceding table are determined in accordance with IPC (Institute for Interconnect and Packaging Circuits) standards, especially Standard 4101—specifications for base materials for rigid and multilayer printed boards.

Comparison of the results presented in the preceding table for "Control", relative to the invention formulations containing at least 25 phr of 1,3-PBO, reflect the substantial improvement in such performance properties as peel strength of invention laminates, despite the presence of filler (note that control samples do not contain filler—thus invention formulations provide enhanced adhesion even in the presence of added filler material), and thermal conductivity, while retaining comparable performance properties with respect to all other relevant performance criteria.

Example 2

Additional exemplary filled resin formulations according to the invention were prepared employing silica as the filler, instead of alumina. Thus, silica (at 50-150 PHR), 1,3 PBO (5 PHR), allylated BMI (Kerimid 8292; available from Huntsman, Salt Lake City, Utah) and TPP catalyst (0.05 PHR) were combined and tested. Performance properties are presented in the following table:

| Parameter/Property | FB-8S Silica | | |
| --- | --- | --- | --- |
|  | 50 phr | 100 phr | 150 phr |
| Prepreg 7628, % RC/% Flow | 36/9 | 43/9 | 48/6 |
| # of plies | 2 | 2 | 2 |
| Electrical Strength, V/mil | 931 | 1207 | 773 |
| Decomposition Temp. Td (5%) | 414.1 | 414.84 | 408.9 |
| Decomposition Temp. Td, ° C. | 375.3 | 367.0 | 373.8 |
| Peel Strength (AR/AS), lbs/in | 6.7/6.0 | 6.6/6.2 | 6.6/6.7 |
| Solder Float, seconds | 507 | 57 | 285 |
| Thermal Conductivity $T_c$, W/mK | 0.53 | 0.60 | 0.63 |
| Laminate Thickness, Mils | 13.3 | 14.7 | 15.9 |

The results presented in the preceding table demonstrate the benefits of invention formulations with a silica filler, as an alternative to the use of an alumina filler (see Example 1).

Unless otherwise defined, all technical and scientific terms used herein have the same meaning as commonly understood by one of ordinary skill in the art to which this invention belongs.

The inventions illustratively described herein may suitably be practiced in the absence of any element or elements, limitation or limitations, not specifically disclosed herein. Thus, for example, the terms "comprising," "including," "containing," etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the invention claimed.

Thus, it should be understood that although the present invention has been specifically disclosed by preferred embodiments and optional features, modification, improvement and variation of the inventions embodied therein herein disclosed may be resorted to by those skilled in the art, and that such modifications, improvements and variations are considered to be within the scope of this invention. The materials, methods, and examples provided here are representative of preferred embodiments, are exemplary, and are not intended as limitations on the scope of the invention.

The invention has been described broadly and generically herein. Each of the narrower species and subgeneric groupings falling within the generic disclosure also form part of the invention. In addition, where features or aspects of the invention are described in terms of Markush groups, those skilled in the art will recognize that the invention is also thereby described in terms of any individual member or subgroup of members of the Markush group.

All publications, patent applications, patents, and other references mentioned herein are expressly incorporated by reference in their entirety, including all formulas and figures, to the same extent as if each were incorporated by reference individually. In case of conflict, the present specification, including definitions, will control.

Other embodiments are set forth within the following claims.

That which is claimed is:

1. A composition comprising:
   (a) a crosslinkable maleimide compound having the structure:

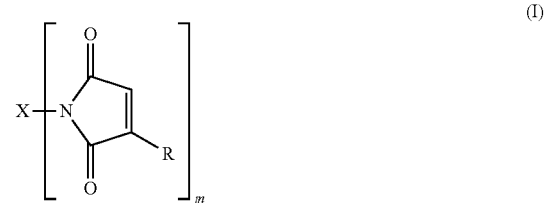

(I)

wherein:
   X is optionally substituted alkylene or optionally substituted cycloalkylene,
   each R is independently H or optionally substituted lower alkyl, and
   m is at least 2,
(b) a crosslinkable oxazoline compound,
(c) a crosslinkable compound capable of reacting with (a) and/or (b), wherein said crosslinkable compound capable of reacting with (a) and/or (b) is an allylically substituted hydroxy-aromatic compound having the structure:

$$Ar'(OH)_a(-CH_2-CH=CH_2)_b,$$

wherein:
   Ar' is optionally substituted arylene, polyarylene, heteroarylene or polyheteroarylene,
   a is at least 2, and
   b is at least 2, and
(d) at least one performance-modifying component.

2. The composition of claim 1 wherein X is optionally substituted alkylene.

3. The composition of claim 1 wherein X is optionally substituted cycloalkylene.

4. The composition of claim 1 wherein said crosslinkable oxazoline compound has the structure:

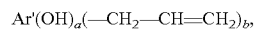

wherein:
   Ox is an optionally substituted oxazoline ring,
   Z is optionally substituted alkylene, cycloalkylene, arylene, polyarylene, heteroarylene or polyheteroarylene, and
   n is at least 2.

5. The composition of claim 4 wherein Z is optionally substituted alkylene.

6. The composition of claim 4 wherein Z is optionally substituted cycloalkylene.

7. The composition of claim 4 wherein Z is optionally substituted arylene.

8. The composition of claim 4 wherein Z is 1,3-phenylene.

9. The composition of claim 1 wherein said performance-modifying component is selected from the group consisting of fillers, curing agents, cure retardants, cure accelerators, flexibilizers, anti-oxidants, flame retardants, fire retardants, dyes, pigments, flow modifiers, plasticizers, surfactants, strength enhancers, UV protectors, and mixtures of any two or more thereof.

10. The composition of claim 9 wherein said filler is neither thermally nor electrically conductive.

11. The composition of claim 9 wherein said filler is thermally conductive.

12. The composition of claim 11 wherein said filler is also electrically conductive.

13. The composition of claim 9 wherein said filler is electrically conductive.

14. The composition of claim 9 wherein said filler is selected from the group consisting of soft fillers, naturally occurring minerals, synthetic fused minerals, treated fillers, organic polymers, and microspheres.

15. The composition of claim 14 wherein said filler is selected from the group consisting of talc, aluminum nitride, boron nitride, silicon carbide, diamond, graphite, beryllium oxide, magnesia, silica, alumina, aluminum silicates, cordierite, silane-treated minerals, and polytetrafluoroethylene.

16. The composition of claim 1 wherein the weight ratio between (a) and (c) is at least about 1:20 up to about 20:1.

17. The composition of claim 1 wherein the weight ratio between (a) and (c) is at least about 1:10 up to about 10:1.

18. The composition of claim 1 wherein the weight ratio between (a) and (c) is at least about 1:5 up to about 5:1.

19. The composition of claim 1 wherein the weight ratio between (a) and (c) falls in the range of about 1:1 up to about 3:1.

20. The composition of claim 1 wherein component (b) is present in the range of about 1-10 wt %, based on the total weight of components (a) and (c), taken together.

21. The composition of claim 1 wherein component (b) is present in the range of about 3-5 wt %, based on the total weight of components (a) and (c), taken together.

22. The composition of claim 1 wherein component (d) is present in the range of about 1% up to about 200% by weight, based on the total weight of components (a), (b) and (c), taken together.

23. The composition of claim 1, wherein component (d) comprises one or more flexibilizers, anti-oxidants, flame retardants, dyes, pigments, or surfactants.

24. A composition of comprising:
(a) a crosslinkable maleimide compound having the structure:

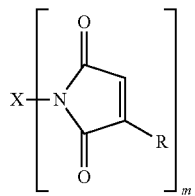

(I)

wherein:
X is optionally substituted alkylene, cycloalkylene, arylene, polyarylene, heteroarylene, or polyheteroarylene,
each R is independently H or optionally substituted lower alkyl, and
m is at least 2,
(b) a crosslinkable oxazoline compound,
(c) a crosslinkable compound capable of reacting with (a) and/or (b), wherein said crosslinkable compound capable of reacting with (a) and/or (b) is an allylically substituted hydroxy-aromatic compound having the structure:

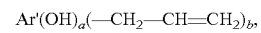

wherein:
Ar' is optionally substituted bis-arylene,
a is at least 2, and
b is at least 2, and
(d) at least one performance-modifying component.

25. The composition of claim 24 wherein said bis-arylene has the structure:

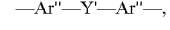

wherein:
each Ar" is independently phenylene or substituted phenylene bearing at least one OH and at least one —CH$_2$—CH═CH$_2$ thereon, and
Y' is a bond, —O—, —S(O)$_m$—, wherein m is 0, 1 or 2, or —(CR'$_2$)$_x$—, wherein each R' is independently H, halogen, or optionally substituted lower alkyl, and x is 1-10.

26. The composition of claim 25 wherein each Ar" is phenylyene, and Y' is —(CR'$_2$)$_x$—, wherein each R' is independently H or lower alkyl, and x is 0 or 1.

27. The composition of claim 24 wherein Ar' is -Ph-C(CH$_3$)$_2$-Ph-.

28. The composition of claim 24 wherein said allylically substituted hydroxy-aromatic compound is an allylically substituted bisphenol A.

29. The composition of claim 24 wherein said allylically substituted phenol compound is diallyl bisphenol A.

30. The composition of claim 29 wherein at least one allylic substitution on said phenol compound is at the ortho position.

31. The composition of claim 29 wherein at least one allylical substitution on said phenol compound is at the para position.

32. A composition comprising:
(a) a crosslinkable maleimide compound having the structure:

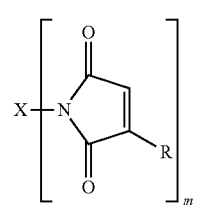

(I)

wherein:
X is optionally substituted alkylene or optionally substituted cycloalkylene,
each R is independently H or optionally substituted lower alkyl, and
m is at least 2, (b) a crosslinkable oxazoline compound,
(c) a crosslinkable compound capable of reacting with (a) and/or (b), wherein said crosslinkable compound capable of reacting with (a) and/or (b) is an allylically substituted hydroxy-aromatic compound having the structure:

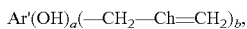

Ar'(OH)$_a$(—CH$_2$—Ch=CH$_2$)$_b$, wherein:
Ar' is optionally substituted arylene, polyarylene, heteroarylene or polyheteroarylene,
a is at least 2, and
b is at least 2, and
(d) at least one performance-modifying component, wherein component (d) comprises one or more curing agents.

33. The composition of claim 32 wherein said curing agent is an aryl phosphite.

34. The composition of claim 33 wherein said aryl phosphite is selected from the group consisting of diphenyl hydrogen phosphite (DPP); dicresyl hydrogen phosphite; phenyl p-cresyl hydrogen phosphite; phenyl m-cresyl hydrogen phosphite; dinaphthyl hydrogen phosphite; diphenyl isopropyl phosphite; diphenyl methyl phosphite, di(p-cresyl)hexyl phosphite, triphenyl phosphite (TPP), tri(m-cresyl)phosphite, diphenyl isooctyl phosphite, diphenyl 2-ethylhexyl phosphite, diphenyl isodecyl phosphite, diphenyl cyclohexyl phosphite, and 2-chloroethyl diphenyl phosphite.

35. An article comprising a partially or fully cured layer of the composition of claim 1 on a substrate.

36. The article of claim 35 wherein said substrate is a woven or non-woven organic or inorganic substrate.

37. The article of claim 36 wherein said organic substrate is a polyester, a liquid crystalline polymer (LCP), a polyphenylene sulfide (PPS), a polyphenylene oxide (PPO), a polybenzoxazoline (PBO), an Aramid, or a conductive material.

38. The article of claim 36 wherein said inorganic substrate is a woven or non-woven glass, a woven or non-woven quartz, or a conductive material.

39. The article of claim 38 wherein said conductive material is silver, nickel, gold, cobalt, copper, aluminum, graphite, silver-coated graphite, nickel-coated graphite, alloys of silver, nickel, gold, cobalt, copper and/or aluminum.

40. A prepreg produced by impregnating a porous substrate with a composition according to claim 1, and subjecting the resulting impregnated substrate to conditions suitable to remove substantially all of the diluent therefrom.

41. The prepreg of claim 40 wherein said substrate is woven or non-woven.

42. A laminated sheet produced by layering and molding a prescribed number of sheets of the prepreg of claim 40.

43. The laminated sheet of claim 42 further comprising one or more conductive layers.

44. The laminated sheet of claim 43 wherein said one or more conductive layers are selected from the group consisting of a metal foil, and an electrically conductive polymeric layer.

45. A printed wiring board layer produced by forming conductive patterns on the surface of the laminated sheet of claim 42.

46. A multilayer printed wiring board produced by layering and molding a prescribed number of sheets of the patterned laminate layers of claim 45, bonded together with one or more layers of prepreg from which the printed wiring board layer was prepared.

47. A method of making an article, said method comprising applying a composition according to claim 1 to a suitable substrate, and thereafter curing said composition.

48. A method for improving adhesion of inorganic-filled polyimide-based formulations to a substrate, said method comprising adding to a formulation according to claim 1 an amount of a bisoxazoline effective to improve the adhesion thereof to said substrate upon cure, wherein the bisoxazoline has the structure:

Z—(Ox)$_n$ wherein:
Ox is an optionally substituted oxazoline ring,
Z is optionally substituted alkylene, cycloalkylene, arylene, polyarylene, heteroarylene or polyheteroarylene, and
n is at least 2.

49. A method of adhering inorganic-filled polyimide-based formulations to a substrate, said method comprising applying a composition according to claim 1 to a suitable substrate, and curing said composition.

* * * * *